(12) United States Patent
Waite et al.

(10) Patent No.: US 10,090,166 B2
(45) Date of Patent: Oct. 2, 2018

(54) TECHNIQUES FOR FORMING ISOLATION STRUCTURES IN A SUBSTRATE

(71) Applicant: Varian Semiconductor Equipment Associates, Inc., Gloucester, MA (US)

(72) Inventors: Andrew Michael Waite, Beverly, MA (US); Morgan D. Evans, Manchester, MA (US); Johannes M. van Meer, Middleton, MA (US); Jae Young Lee, Bedford, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/400,668

(22) Filed: Jan. 6, 2017

(65) Prior Publication Data

US 2018/0197747 A1    Jul. 12, 2018

(51) Int. Cl.
*H01L 21/3105*     (2006.01)
*H01L 21/762*      (2006.01)
*H01L 21/311*      (2006.01)

(52) U.S. Cl.
CPC .. *H01L 21/31056* (2013.01); *H01L 21/31051* (2013.01); *H01L 21/31053* (2013.01); *H01L 21/31055* (2013.01); *H01L 21/76224* (2013.01); *H01L 21/31105* (2013.01); *H01L 21/76229* (2013.01)

(58) Field of Classification Search
None
See application file for complete search history.

(56) References Cited

U.S. PATENT DOCUMENTS

2015/0255300 A1* 9/2015 He ................ H01L 21/3088
                                                    257/401

* cited by examiner

*Primary Examiner* — Jiong-Ping Lu

(57) ABSTRACT

A method may include performing a chemical mechanical polishing (CMP) etch of a fin assembly disposed on a substrate, the fin assembly comprising a plurality of fin structures coated with an oxide layer, wherein as a result of the CMP etch, a first portion of the oxide layer is removed, and the fin structures remain covered with oxide. The method may further include performing a selective area processing (SAP) etch using ions, wherein a second portion of the oxide layer is removed in a non-uniform manner, wherein after the SAP etch, the fin structures remain covered with oxide.

18 Claims, 7 Drawing Sheets

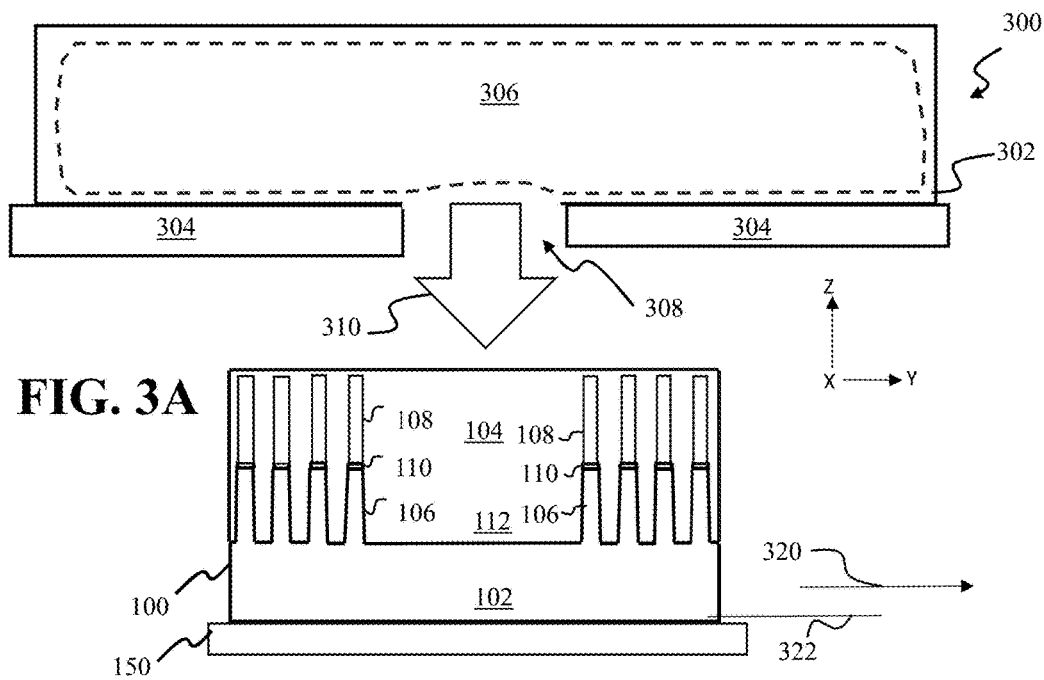
FIG. 3A
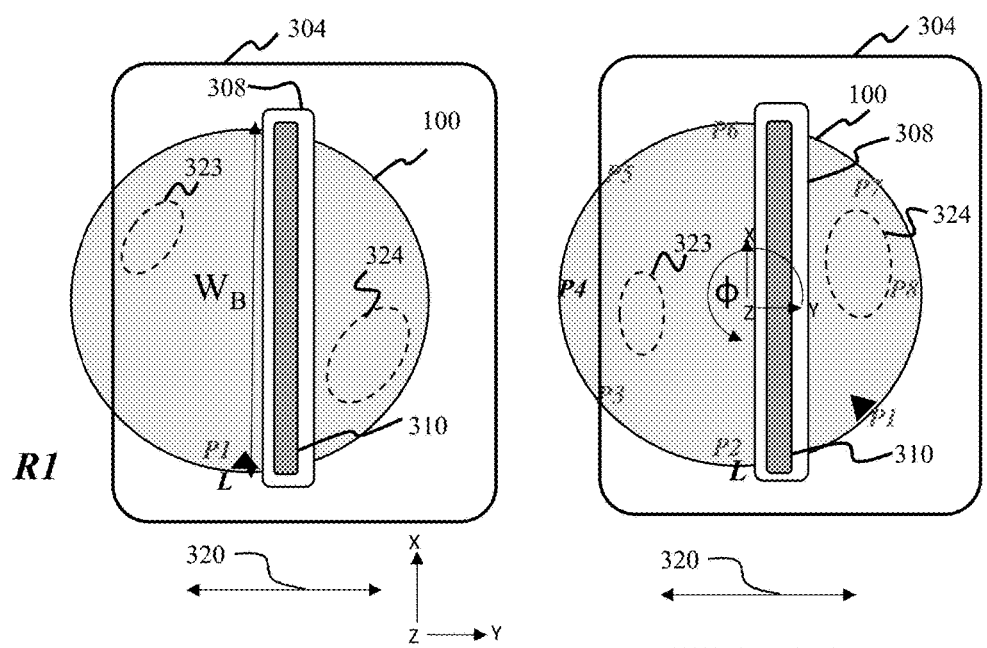
FIG. 3B     FIG. 3C

PERFORM CHEMICAL MECHANICAL POLISHING ETCH OF FIN ASSEMBLY, INCLUDING PLURALITY OF FIN STRUCTURES COATED WITH AN OXIDE LAYER, WHEREIN FIRST PORTION OF OXIDE LAYER IS REMOVED
402

PERFORM SELECTIVE AREA PROCESSING ETCH USING IONS, WHEREIN SECOND PORTION OF OXIDE LAYER IS REMOVED
404

PERFORM FIRST OXIDE ETCH WHEREIN THIRD PORTION OF OXIDE LAYER IS REMOVED
406

PERFORM SELECTIVE NITRIDE ETCH WHEREIN NITRIDE LAYER OF FIN STRUCTURES IS REMOVED
408

PERFORM SECOND OXIDE ETCH WHEREIN UPPER PORTION OF SEMICONDUCTOR LAYER OF FIN STRUCTURES IS EXPOSED
410

PROVIDE FIN STRUCTURES ON SUBSTRATE, COMPRISING PLURALITY OF NITRIDE STRUCTURES
502

REMOVE PLURALITY OF NITRIDE STRUCTURES FROM FIN STRUCTURES, WHEREIN PLURALITY OF SEMICONDUCTOR FIN STRUCTURES EXPOSED
504

DEPOSIT OXIDE LAYER ON PLURALITY OF SEMICONDUCTOR FIN STRUCTURES
506

PERFORM CHEMICAL MECHANICAL POLISHING ETCH, WHEREIN FIRST PORTION OF OXIDE LAYER IS REMOVED
508

PERFORM SELECTIVE AREA PROCESSING ETCH USING IONS, WHEREIN SECOND PORTION OF OXIDE LAYER IS REMOVED AND PLURALITY OF SEMICONDUCTOR FIN STRUCTURES REMAIN COVERED WITH OXIDE
510

PERFORM OXIDE ETCH WHEREIN UPPER PORTION OF SEMICONDUCTOR FIN STRUCTURES IS EXPOSED
512

TECHNIQUES FOR FORMING ISOLATION STRUCTURES IN A SUBSTRATE

FIELD

The present embodiments relate to semiconductor device processing techniques, and more particularly, to generating isolation structures.

BACKGROUND

Formation of device structures in semiconductor substrates such as silicon may include generating isolation structures such as shallow trench isolation (STI) structures, where oxide material may be deposited on pre-existing structures and etched to form a final isolation structure. In the case of fin-type field effect transistors (finFET), a series of sacrificial layers may be deposited on top of a monocrystalline semiconductor layer, such as silicon. The sacrificial layers may then be etched in a patterned etch to generate designed pattern structures including underlying monocrystalline semiconductor fins. This patterning may be followed by blanket deposition of an oxide layer on the patterned structures. The deposited oxide layer may subsequently be removed in part to form a final isolation structure that reveals at least a portion of underlying fins. Because the blanket deposition takes place over patterned structures, the removal of the deposited oxide may entail a series of operations, including chemical; mechanical polishing, to planarize the oxide layer as the final STI structure is being formed. While chemical mechanical polishing (CMP) processing may be an integral part of the formation of the final STI structure, the CMP processing may result in patterning effects, at the microscopic level, as well as at the macroscopic level across a substrate (wafer).

For example, in open regions, such as field oxide regions, where fin structures are sparse or absent, dishing of the oxide layer may take place during CMP processing, resulting in a non-uniform oxide layer thickness, especially in open regions. This non-uniformity may persist up to final etching operations where the semiconductor fins are revealed. With respect to these and other considerations the present disclosure is provided.

BRIEF SUMMARY

In one embodiment, a method may include performing a chemical mechanical polishing (CMP) etch of a fin assembly disposed on a substrate, where the fin assembly comprises a plurality of fin structures coated with an oxide layer. As a result of the CMP etch, a first portion of the oxide layer may be removed, and the fin structures may remain covered with oxide. The method may further include performing a selective area processing (SAP) etch using ions, wherein a second portion of the oxide layer is removed in a non-uniform manner, wherein after the SAP etch, the fin structures remain covered with oxide.

In another embodiment, a method may include providing, on a substrate, a plurality of fin structures comprising a plurality of nitride structures disposed over a plurality of semiconductor fin structures. The method may also include removing the plurality of nitride structures, wherein the plurality of semiconductor fin structures are exposed, and depositing an oxide layer on the plurality of semiconductor fin structures. The method may further include performing a chemical mechanical polishing (CMP) etch, wherein a first portion of the oxide layer is removed. The method may additionally include performing a selective area processing (SAP) etch using ions, wherein a second portion of the oxide layer is removed in a non-uniform manner, wherein after the SAP etch, the plurality of semiconductor fin structures remain covered.

In an additional embodiment a method may include performing a chemical mechanical polishing (CMP) etch of a patterned structure assembly disposed on a substrate, the patterned structure assembly comprising a plurality of patterned structures coated with an oxide layer. As a result of the CMP etch, a first portion of the oxide layer may be removed, and the patterned structures may remain covered with oxide. The method may further include: after the CMP etch, performing a selective area processing (SAP) etch using a ribbon ion beam, the SAP etch comprising a non-uniform etch process tailored according to a thickness non-uniformity of the oxide layer across the substrate. The thickness non-uniformity may be determined after the CMP etch.

BRIEF DESCRIPTION OF THE DRAWINGS

FIG. 3A shows a side view of a processing apparatus and substrate in an instance of an etch operation according to embodiments of the disclosure;

FIG. 3B and FIG. 3C show a top plan view of one variant of the exemplary operation of FIG. 3A;

FIG. 4 presents an exemplary process flow according to embodiments of the disclosure; and FIG. 5 presents another exemplary process flow according to embodiments of the disclosure.

Figure 1A:
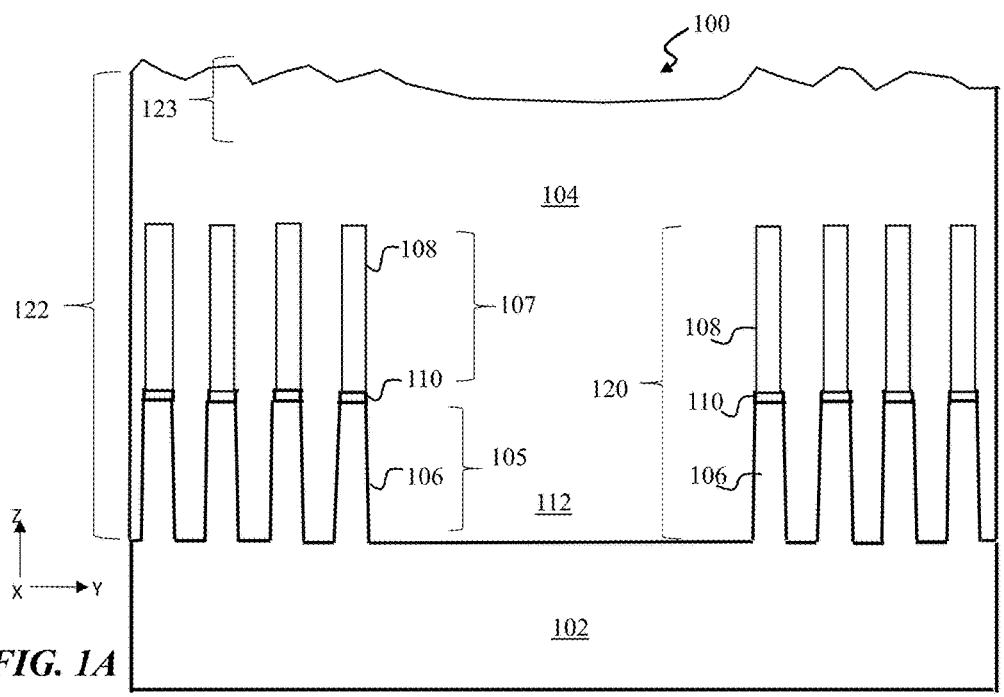
FIGS. 1A-1E depict side cross-sectional views of a substrate during various operations for forming an isolation structure, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques to form isolation structures in a substrate and in particular in a semiconductor device, such as a finFET. The present embodiments address issues related to uniformity of isolation oxide, such as shallow trench isolation (STI) oxide, when formed on a substrate having patterned structures, such as fin structures.

FIGS. 1A-1E depict side cross-sectional views of a substrate 100 during various operations involved for forming an isolation structure, according to embodiments of the disclosure. Turning now to FIG. 1A there is shown a substrate 100 including a substrate base 102, where the substrate base 102 may represent a monocrystalline semiconductor, such as monocrystalline silicon. In various embodiments, the substrate base 102 may include a plurality of regions, where an uppermost region of the substrate base 102 is a monocrystalline semiconductor. As such, the substrate 100 may include other regions (not shown) disposed below the substrate base 102 as shown in FIG. 1A. The embodiments are not limited in this context.

As shown in FIG. 1A, the substrate 100 includes a plurality of fin structures 120, wherein the fin structures 120 are formed within a nitride layer 107 and a semiconductor layer 105. The structure of the substrate 100 at the stage of operation of FIG. 1A may be formed by providing a semiconductor layer in a substrate, as represented by semiconductor layer 105, and forming a nitride layer 107, such as a nitride etch stop layer, on the semiconductor layer 105. As shown in FIG. 1A, the nitride layer 107 is patterned into a plurality of nitride structures 108, and the semiconductor layer 105 is patterned into a plurality of semiconductor fins 106. As suggested by FIG. 1A, the semiconductor layer 105 and substrate base 102 may be part of a unitary structure, such as monocrystalline silicon. As such, the semiconductor layer 105 represents the upper portion of the substrate base 102 that is patterned into semiconductor fins 106.

Notably, before the instance depicted in FIG. 1A, a mask layer, such as a polysilicon hard mask layer (not shown) may be formed on the nitride layer 107. The polysilicon layer may be patterned into structures, such as a plurality of polysilicon mandrels, and may be used to form the plurality nitride structures 108, by etching the nitride layer 107 to form the nitride structures 108, as known in the art. Additionally, in further operations, the semiconductor layer 105 may be etched using the nitride structures 108 as a mask, wherein the semiconductor fins 106 are formed, as also known in the art. Furthermore, a pad oxide layer, shown as pad oxide structures 110, may be included between the nitride structures 108 and semiconductor fins 106, as also known in the art.

As shown in FIG. 1A the resulting fin structures, fin structures 120, are made of a plurality of nitride structures 108 disposed over a plurality of semiconductor fins 106, respectively, where a plurality of pad oxide structures 110 are disposed between the plurality of semiconductor fins 106 and the plurality of nitride structures 108. In order to form an isolation structure, an oxide layer 104 may be deposited over the fin structures 120 using any suitable method as known in the art, resulting in the fin assembly 122 of FIG. 1A, including oxide layer 104 and fin structures 120. As shown in FIG. 1A, the upper surface of oxide layer 104 may be non-uniform, reflecting height disparities generated by the fin structures 120 along the Z-axis of the Cartesian coordinate system shown. In addition to variation in oxide layer thickness in regions over the fin structures 120, a sag in oxide layer thickness may occur in a field region 112 between regions of densely packed fin structures, shown as the fin structures 120 to the left and right portions of the substrate 100. In some examples, the height disparity along the Z-axis of the upper surface of oxide layer 104 may be several nanometers to tens of nanometers, such as for fin structures 120 having a height on the order of tens of nanometers.

In order to expose the top of semiconductor fins 106 so device structures may be formed within the semiconductor fins 106 according to known processing techniques, a target amount of oxide layer 104 is to be removed after deposition. In the exemplary operations depicted in FIGS. 1B-1E, a novel combination of processing is performed to improve local thickness uniformity within the X-Y plane of the final oxide layer, such as over the scale of micrometers or nanometers. The novel combination of processing also improves macroscopic thickness uniformity over the scale of millimeters or centimeters across the surface of a substrate, such as a semiconductor wafer.

Figure 1B:
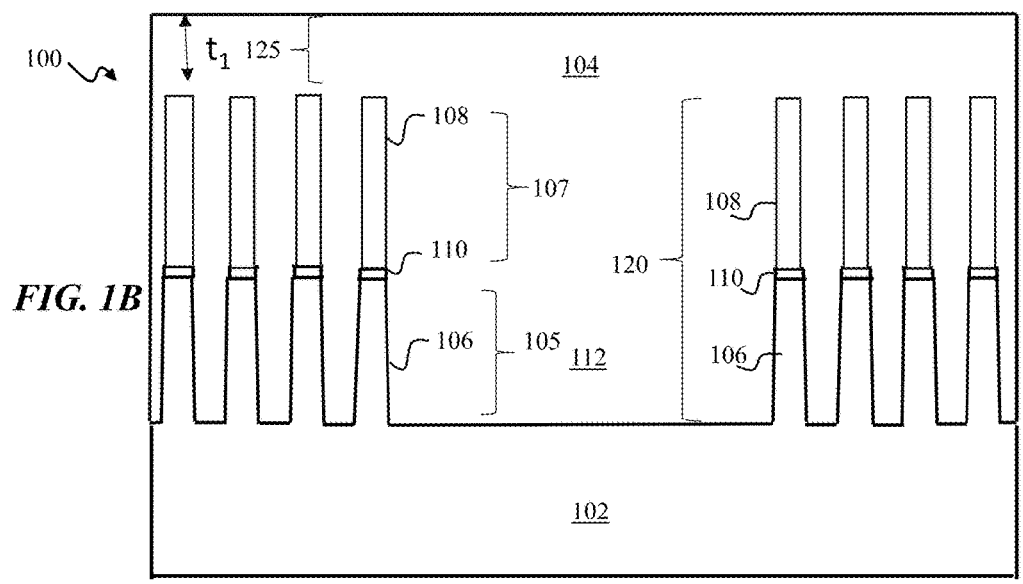

Turning to FIG. 1B, there is shown a second instance of processing the substrate 100, after performing of a chemical mechanical polishing (CMP) etch of the fin assembly 122. With reference also to FIG. 1A, the CMP etch may be performed according to known techniques where a first portion 123 of the oxide layer 104 is removed. The CMP etch may be effective to polish micrometer scale or nanometer scale non-uniformities in thickness, such as non-uniformities on the order of tens or nanometers or more. Accordingly, in FIG. 1B the upper surface of the oxide layer 104 may be smoother on a nanometer scale as suggested in FIG. 1B. While not limited to a particular size range, in various embodiments the size of the fin structures 120 along the Y-axis may be several nanometers to tens of nanometers, while the height of the fin structures 120 may be on the order of 10 nanometers, 20 nanometers, 50 nanometers, or more. In addition, the fin structures 120 may extend tens of nanometers along the X-axis.

At the stage of processing shown in FIG. 1B, fin structures 120 remain covered with the oxide layer 104. While the surface of oxide layer 104 may present a relatively smooth surface at the nanometer level or sub-micrometer level as suggested by FIG. 1B, the uniformity of thickness of oxide layer 104 within the X-Y plane, that is, the plane of the substrate 100, may vary over a macroscopic level, such as over centimeters or millimeters over a wafer surface. As in known CMP processing, macroscopic thickness non-uniformity over a wafer surface may be introduced as an inherent part of the CMP process. In addition, known CMP processing may introduce microscopic non-uniformities in thickness due to pattern dependent effects, such as when patterned structures such as the fin structures 120 are revealed during CMP etching. Accordingly, the operation of FIG. 1B may be designed to leave a designated average thickness of oxide layer 104 above the fin structures 120. The designated thickness of oxide layer 104 to be left may take into account macroscopic thickness non-uniformities in the thickness of oxide layer 104. For example, if a known CMP etch process introduces on average a macroscopic thickness variation in oxide layer 104 thickness of 30 nm across a substrate 100, the CMP etch process may be designed to leave an average thickness of 50 nm of oxide layer 104, shown as t1 in FIG. 1B. This thickness may be designed to ensure that oxide remains above all portions of fin structures 120 across an entirety of a substrate 100. The embodiments are not limited in this context.

Figure 1C:
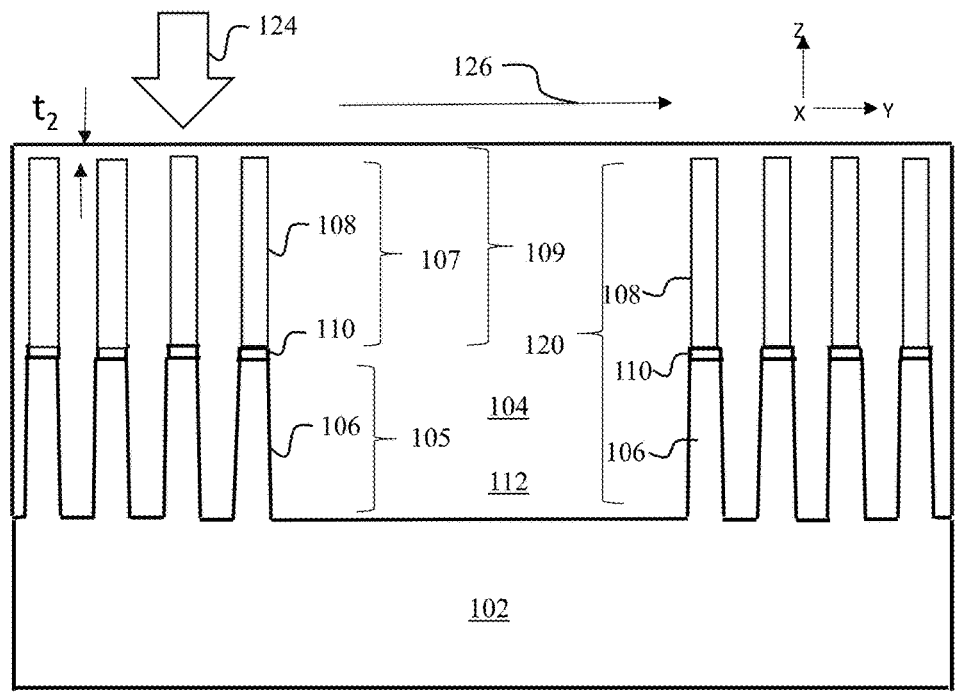

Turning now to FIG. 1C there is shown a further instance of the substrate 100 after performing of a selective area processing (SAP) etch using ions 124, in accordance with embodiments of the disclosure. Referring also to FIG. 1B, at the instance depicted in FIG. 1C a second portion 125 of the oxide layer 104 has been removed, wherein after the SAP etch the nitride layer 107 remains covered with oxide. Details of SAP processing according to some embodiments will be presented below with respect to FIGS. 3A-3C. In brief, the SAP etch of FIG. 1C may involve exposing the substrate to an ion beam as represented by ions 124. The ion beam may be scanned over the upper surface of the oxide layer 104 so as to etch the oxide layer 104 according to a designed etch recipe or etch program. The designed etch recipe may be chosen to account for and remove existing non-uniformities in thickness (along the Z-axis) of the oxide layer 104 across the substrate 100. The removal of non-uniformities in thickness may be accomplished, in particular, by scanning the substrate 100 along a scan direction 126 with respect to ions 124 to provide a non-uniform etch process to etch the oxide layer 104 within the plane of the substrate (X-Y) plane. In particular, the non-uniform etching takes place at the macroscopic level, such as at the millimeter level or centimeter level. In this manner, thickness non-uniformities of oxide layer 104 at the macroscopic level in the X-Y plane that are present after the CMP etch of FIG. 2B, may be removed by controlling the ions 124 to etch thicker regions of oxide layer 104 relatively more than the etching of thinner regions of oxide layer 104. As a result, the SAP process may be designed to leave an average thickness of 5 nm, 10 nm, 20 nm, or other value of oxide layer 104, shown as t2 in FIG. 1B, wherein after the SAP etch, the nitride layer 107 remains covered with oxide.

In various embodiments an ion beam composed of the ions 124 may be formed using inert gas ions, wherein etching of the oxide layer 104 is accomplished predominantly through physical sputtering. Since just oxide material from oxide layer 104 is being etched during the SAP etch, the etch rate and total amount of oxide material sputtered may be accurately determined and controlled. Non-inert gas ions may also be suitable for etching the oxide layer 104 in an SAP etch.

Figure 1D:
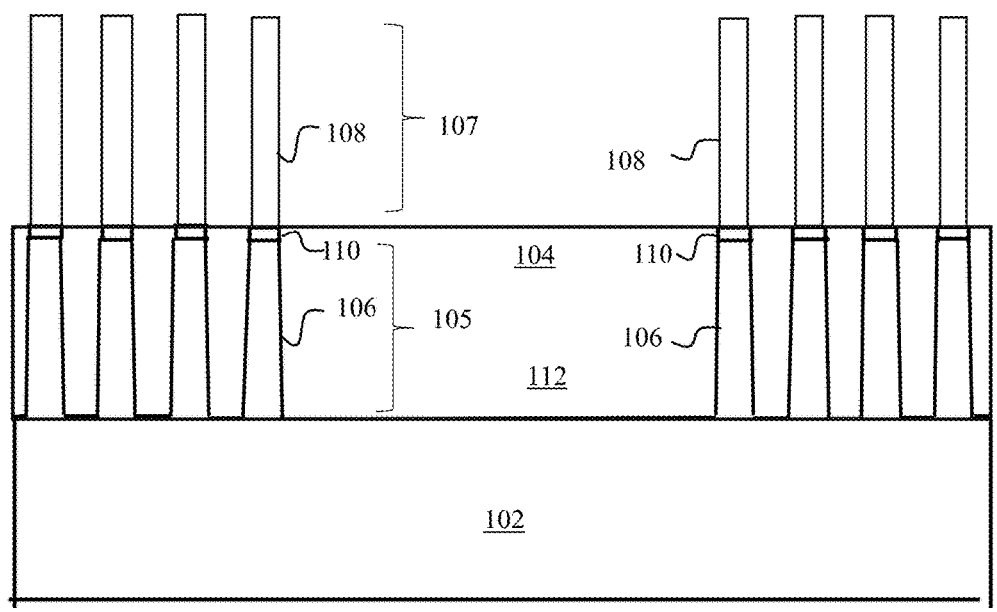

Turning now to FIG. 1D there is shown a subsequent instance after performing a first oxide etch to the structure of FIG. 1C. The first oxide etch may be a known wet oxide etch such as using dilute hydrofluoric acid (HF) solution or other known oxide etch. The selective oxide etch may be designed so as not to damage any semiconductor surfaces that may be exposed during etching, and may be designed to remove a third portion 109 of the oxide layer 104, wherein the nitride layer 107 of the fin structures 120 is exposed. The selective oxide etch of FIG. 1D may uniformly remove oxide so as to preserve a thickness uniformity of the oxide layer, as shown in FIG. 1D.

Figure 1E:
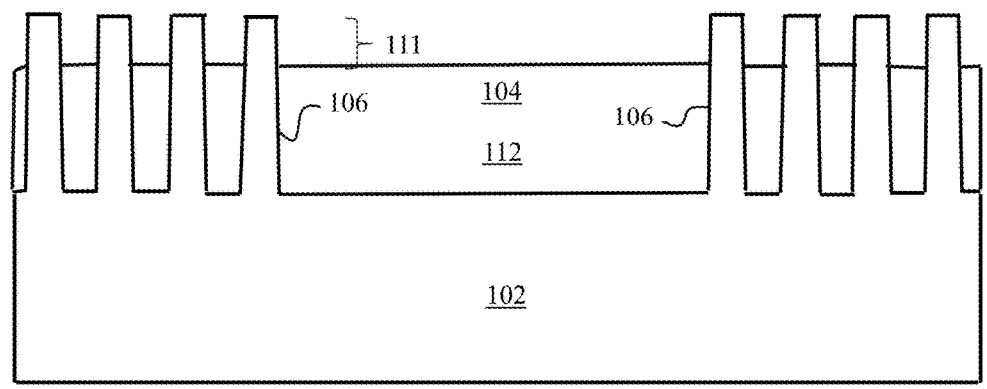

Subsequently, the nitride structures 108 may be removed using known etch processes, such as hot phosphoric acid solution. Next, a second oxide etch may be performed, wherein any portion of pad oxide structure 110 present after prior processing operations is removed. In addition, the upper surface of the oxide layer 104 is recessed below the tops of semiconductor layer 105, wherein an upper portion 111 of the plurality of fin structures 106 is exposed. The resulting structure is shown in FIG. 1E. As shown, a uniform thickness is imparted to the oxide layer 104 at the microscopic level. In addition, the thickness uniformity of oxide layer 104 at a macroscopic generated by the SAP etch process level is preserved. The structure of FIG. 1E provides an improved isolation structure in that isolation oxide thickness uniformity is preserved in field regions 112 at the device level (microscopic level) as well as isolation oxide thickness uniformity across a wafer (macroscopic level).

Figure 2A:
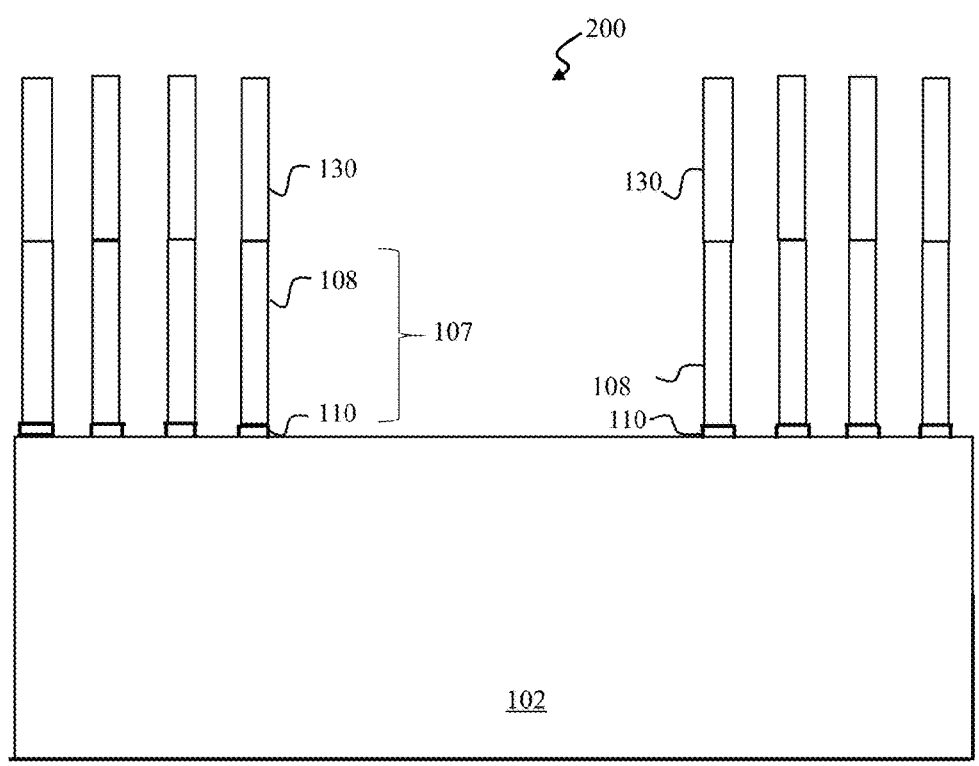
FIGS. 2A-2G depicts a side cross-sectional views of a substrate during various operations for forming an isolation structure, according to additional embodiments of the disclosure.
Figure 2B:
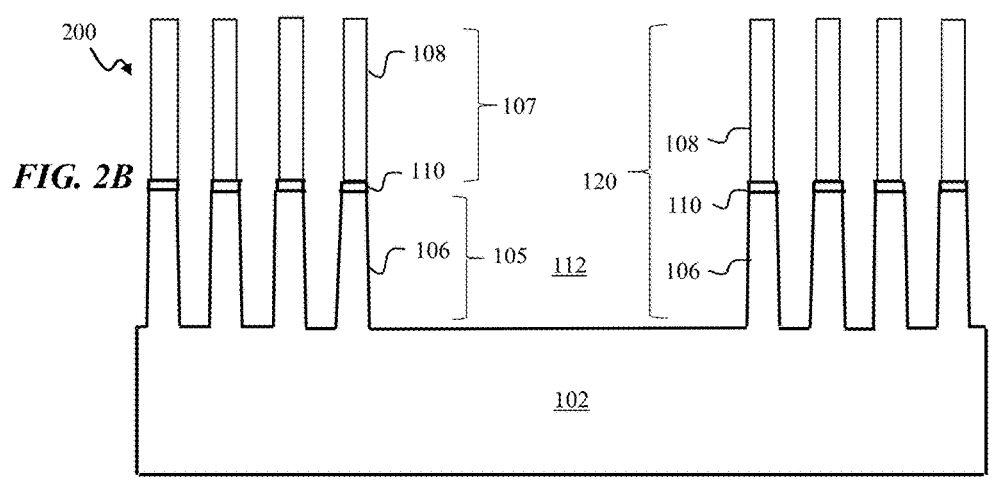

Turning now to FIGS. 2A-2G there is depicted a side cross-sectional view of a substrate 200 during various operations involved for forming an isolation structure, according to additional embodiments of the disclosure. In FIG. 2A, a substrate 200 is shown at an instance of processing where a plurality of mandrels 130, which mandrels may be polysilicon mandrels, have been formed over the nitride layer 107. The mandrels 130 may be formed by known processes from a hard mask layer, and may be used as a hard mask, such as a polysilicon hard mask. As such, the mandrels 130 are used to pattern the nitride layer 107 by etching the nitride layer 107 with the mandrels 130 in place using known processing techniques. At the stage of FIG. 2A the substrate base 102, composed of a semiconductor material, has not been etched. Subsequently, in the example where the mandrels 130 are polysilicon, the mandrels 130 may be removed using a known selective etch to remove polysilicon while preserving the nitride structures 108. The embodiments are not limited in this context. Subsequently, at the instance in FIG. 2B, a portion of the substrate base 102 has been patterned using the nitride structures 108 as an etch mask, forming the semiconductor fins 106, as described above.

Figure 2C:
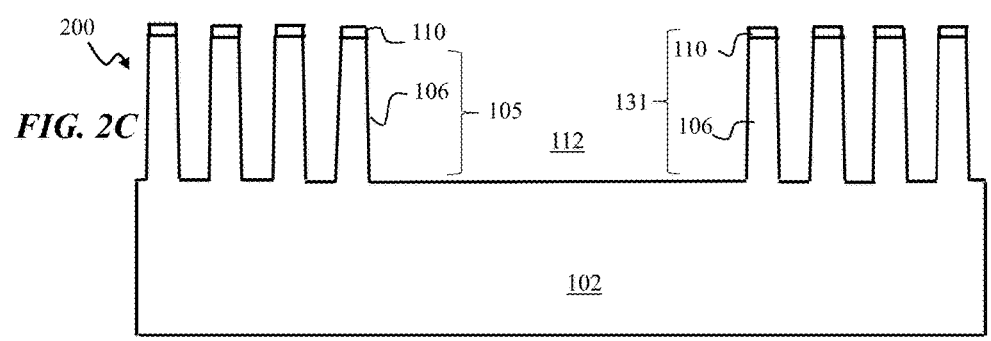

Turning now to FIG. 2C, there is shown a subsequent instance where the nitride layer 107 has been removed. In this embodiment, before deposition of an oxide layer 104, the nitride structures 108 may be selectively etched using, for example, a phosphoric acid etch, to preserve the semiconductor fins 106. As shown, the resulting structures are semiconductor fin structures 131, where a semiconductor fin structure 131 includes a pad oxide structure 110 and semiconductor fin 106.

Figure 2D:
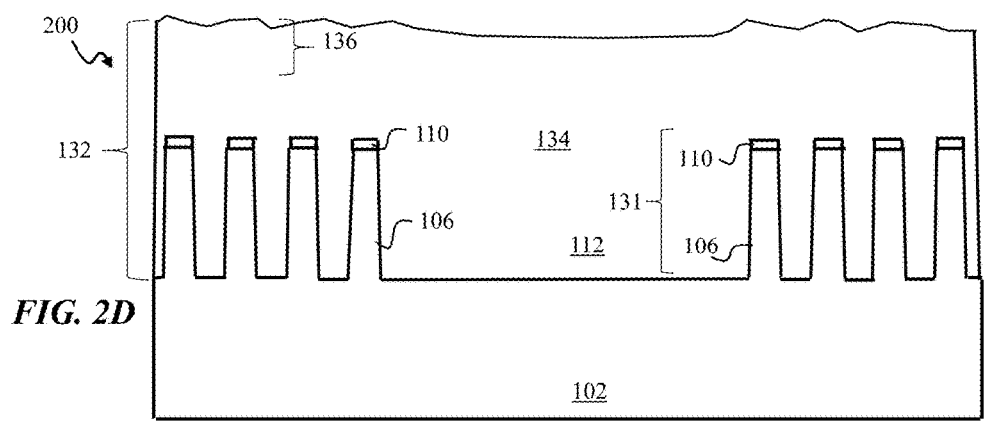

Turning now to FIG. 2D, there is shown a subsequent instance after deposition of an oxide layer 134, forming the fin assembly 132. A difference in this embodiment from the embodiment of FIGS. 1A-1E is that the aspect ratio (height along Z-axis/width along Y-axis) of semiconductor fin structures 131 of the fin assembly 132 is much less than the aspect ratio of fin structures 120 described above, since the semiconductor fin structures 131 lack the nitride structures 108. This lower aspect ratio facilitates much easier filling of the structures using an oxide deposition process.

Additionally, the initial thickness of the oxide layer 134 may be substantially less than the initial thickness of oxide layer 104 as in FIG. 1A. The initial thickness of oxide layer 134 may be reduced by an amount to account for the absence of the nitride layer 107. For example, since the semiconductor fin structures 131 that are covered by the oxide layer 134 lacks the nitride structures 108, the thickness of oxide layer 134 used to cover the semiconductor fin structures 131 may be much less than the thickness of oxide layer 104 used to cover the fin structures 120. For example if the thickness of nitride layer is 50 nm, the initial thickness of oxide layer 134 in FIG. 2D may be reduced by 30 nm to 70 nm with respect to the initial thickness of oxide layer 104 in FIG. 1A. The embodiments are not limited in this context.

Figure 2E:
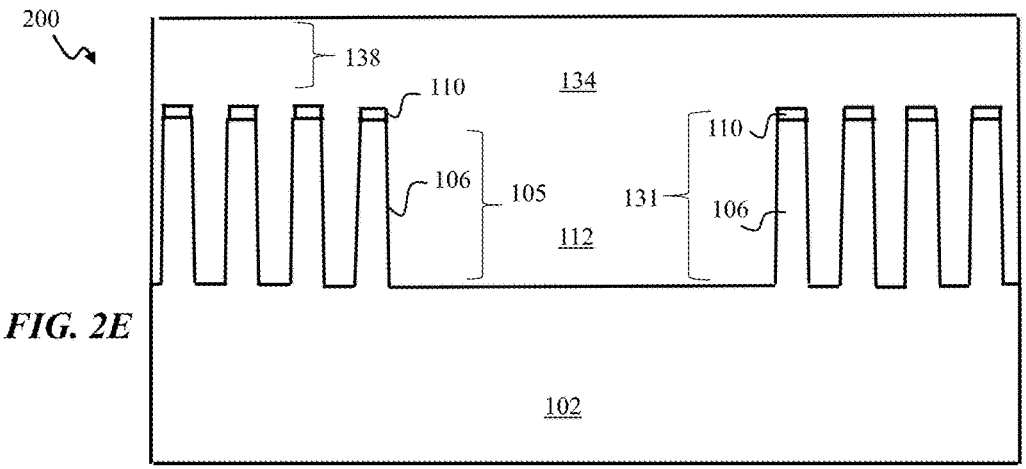
Figure 2F:
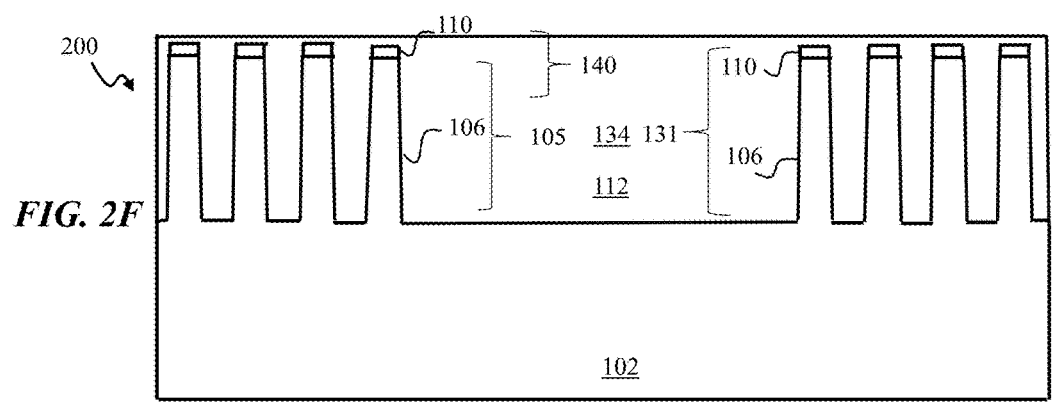

Turning now to FIG. 2E, there is shown a subsequent instance after CMP etching has been performed as generally described above with respect to FIG. 1B, wherein a first portion 136 of oxide layer 134 is removed. Turning now to FIG. 2F, there is shown a subsequent instance after SAP etching has been performed as generally described above with respect to FIG. 1C, wherein a second portion 138 of oxide layer 134 is removed. In the SAP process of FIG. 2F, as with the SAP process of FIG. 1C, an ion beam may be used to etch the oxide layer 134, while in this case, the semiconductor fins 106 remain covered with oxide. In particular, the SAP etch of FIG. 1F may be designed to leave a portion of oxide layer 134 to ensure the semiconductor fins 106 are not damaged.

Figure 2G:
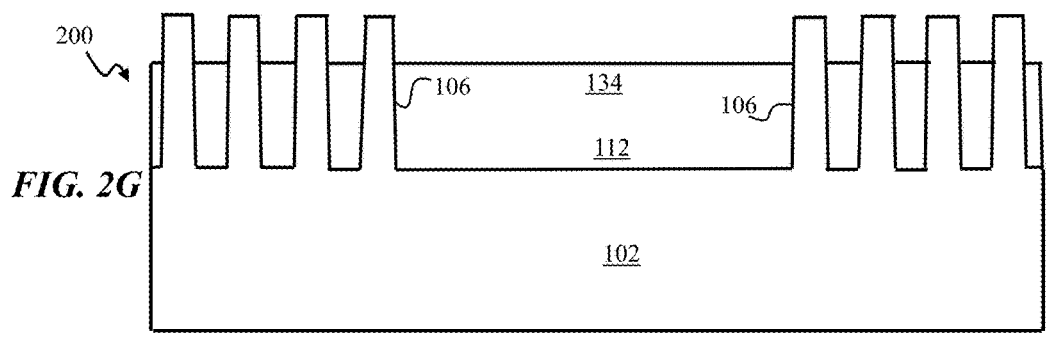

Turning now to FIG. 2G, there is shown a subsequent instance after oxide etching, such as dilute HF or a vapor etching has been performed, wherein a third portion 140 of oxide layer 134 is uniformly etched to generate a uniform oxide thickness, at the microscopic level and the macroscopic level, as described above. At this stage, a portion of the semiconductor fins 106 are exposed, as shown.

Turning now to FIG. 3A there is shown a side view of a processing apparatus and substrate in an instance of an SAP etch operation according to embodiments of the disclosure. In particular, a side view of a processing apparatus 300 is shown in schematic form. The processing apparatus may be a plasma based processing system having a plasma chamber 302 for generating a plasma 306 therein by any convenient method as known in the art. An extraction plate 304 may be provided as shown, having an extraction aperture 308, where during SAP etching an ion beam 310 is extracted through the extraction aperture 308 as shown. The ion beam 310 may be extracted when a voltage difference is applied between the plasma chamber 302 and substrate 100 as in known systems. The ion beam 310 may be extracted as a continuous beam or as a pulsed ion beam as in known systems.

In the example of FIG. 3A the structure of FIG. 1C for substrate 100 is shown for reference. By scanning a substrate stage 150 including substrate 100 with respect to the ion beam 310 along the scan direction 320, parallel to the Y-axis, the ion beam 310 may etch the oxide layer 104 in a non-uniform manner to account for initial differences in thickness of the oxide layer 104 in different regions of substrate 100. In various embodiments, for example, the ion beam 310 may be provided as a ribbon ion beam having a long axis that extends along the X-axis of the Cartesian coordinate system shown. The ion beam 310, by virtue of the scanning of the substrate 100 along the Y-axis, may non-uniformly etch the oxide layer 104 along the Y-axis by varying scan speed or by varying ion current of the ion beam 310 as a function of time during the scan. The ion beam 310 may be directed along an ion trajectory that extends along a perpendicular to the substrate plane 322 in some embodiments, while in other embodiments, the ion trajectory of ion beam 310 may form a non-zero angle with respect to the perpendicular (Z-axis) of the substrate plane 322.

Turning now to FIG. 3B there is shown a top plan view of one variant of the exemplary operation of FIG. 3A. In this example, the substrate 100 is a circular substrate, such as a silicon wafer, and the ion beam 310 is provided as a ribbon ion beam extending to a beam width along the X-axis, where the beam width WB is adequate to expose an entire width of the substrate 100, even at the widest part along the X-axis. Exemplary beam widths may be in the range of 10 cm, 20 cm, 30 cm, or more while exemplary beam lengths along the Y-axis may be in the range of 3 mm, 5 mm, 10 mm, or 20 mm. The embodiments are not limited in this context.

As also indicated in FIG. 3B, the substrate 100 may be scanned in the scan direction 320, where the scan direction 320 lies in the X-Y plane, such as along the Y-axis. Notably, the scan direction 320 may represent the scanning of substrate 100 in two opposing (180 degrees) directions along the Y-axis, or just a scan toward the left or a scan toward the right. As shown in FIG. 3B, the long axis of ion beam 310 extends along the X-axis, perpendicularly to the scan direction 320. Accordingly, an entirety of the substrate 100 may be exposed to the ion beam 310 when scanning of the substrate 100 takes place along a scan direction 320 to an adequate length from a left side to right side of substrate 100 as shown in FIG. 3B.

As also shown in FIG. 3B, the ion exposure of substrate 100 to the ion beam 310 may take place when the substrate 100 is disposed at a first rotational position as indicated by the position P1 on substrate 100 being located under the location L on the extraction plate 304. For example, the position P1 may correspond to the position of a notch or a flat on a wafer. In accordance with various embodiments, a plurality of exposure cycles may be performed to etch the oxide layer 104, where the substrate 100 may be rotated through N different rotational positions, where N corresponds to the number of exposure cycles.

Turning now to FIG. 3C there is shown a top plan view of another instance of an SAP etch process for etching the oxide layer 104. The operations of FIG. 3B and FIG. 3C may be considered to be part of an overall CMP etch operation as generally described above with respect to FIG. 1C. In the instance depicted in FIG. 3C a difference lies in the rotational position of the substrate 100. In this instance, while the substrate 100 is exposed to the ion beam 310, the substrate 100 is disposed at a second rotational position where the position P2 on substrate 100 is located under the location L on the extraction plate 304. The position P2 may represent a position that lies on a radius of substrate 100 rotated at a given angle, such as 45 degrees with respect to the radius that intercepts the position P1. Accordingly, in FIG. 3C, the substrate 100 has been rotated about a perpendicular to substrate plane 322 (X-Y plane, see FIG. 3A) through a twist angle $\phi$ of 45 degrees with respect to the rotational position of FIG. 3B. Processing of the substrate 100 in this second rotational position may proceed similarly to processing in the rotational position of FIG. 3B, where the substrate 100 is again scanned along the scan direction 320 to expose an entirety of substrate 100 to the ion beam 310 in a second exposure.

In accordance with one particular embodiment, the processes shown in FIG. 3B and FIG. 3C may be extended to a designed number of exposure cycles, where a given exposure cycle entails scanning the ion beam 310 along the scan direction 320 and a subsequent rotation of substrate 100 to a new rotational position. In some examples, an SAP etch may comprise 4 exposure cycles, 6 exposure cycles, 8 exposure cycles, or more. In a particular embodiment an SAP etch may involve 8 different exposure cycles where the substrate 100 is disposed at 8 different rotational positions, as indicated by P1, P2, P3, P4, P5, P6, P7, and P8. The 8 different rotational positions may be evenly spaced among one another in certain variants, such as spaced at rotational increments of 45 degrees. In some embodiments, the substrate 100 may be rotated in consecutive exposure cycles between adjacent rotational positions, such as from P1 to P2 to P3, and so forth. In other embodiments, in consecutive exposure cycles, other rotational sequences may be performed, such as P1 to P5 to P2 to P6 to P3 to P7 to P4 to P8. The embodiments are not limited in this context.

Notably the scan profile for a given exposure cycle may be tailored according to the non-uniformity in thickness of oxide layer 104 along the scan direction within the substrate 100 during the given exposure cycle. Thus, while the substrate 100 may be scanned with respect to the ion beam 310 along the same absolute direction (Y-axis) in different exposure cycles, the path of the ion beam 310 may correspond to different paths within the surface of the substrate 100 because of the differing twist angle $\phi$ of the substrate 100. Moreover, the combination of different scans of the ion beam 310 within an SAP etch may be arranged to account for the two dimensional non-uniformity of oxide thickness of oxide layer 104 within the X-Y plane. For example, when the substrate 100 is in the rotational position of FIG. 3B, a uniform scan may be performed, wherein scan speed and ion beam current are constant across the scan. When the substrate 100 is disposed in the rotational position of FIG. 3C, a non-uniform scan may be performed, composed of a plurality of scan segments, wherein a first scan speed of a first scan segment differs from a second scan speed of a second scan segment. Alternatively, the scan speed of substrate 100 may be varied in a continuous manner according to a scan profile to generate a non-uniform etch.

Alternatively, a non-uniform scan may be performed by providing the ion beam 310 as a pulsed ion beam and by varying the duty cycle of the pulsed ion beam at different scan segments as the ion beam 310 is scanned with respect to the substrate 100. A full SAP etch may include any suitable number of N exposure cycles, wherein any combination of uniform and non-uniform scanning may be performed to generate a target a non-uniform etch profile of oxide layer 104. The non-uniform etch profile may be used to reduce or eliminate any non-uniform thickness of the oxide layer 104 at the macroscopic level within the X-Y plane.

Accordingly, referring again to FIG. 3B, as the result of an SAP etch, a first thickness of the oxide layer 104 may be removed in a first region 323 of the substrate 100 and a second thickness of the oxide layer may be removed in a second region 324 of the substrate 100, where the first thickness and second thickness differ. This differential removal may compensate for differences in oxide thickness between the first region 323 and second region 324.

According to various embodiments, a two dimensional thickness map providing the thickness of an oxide layer such as oxide layer 104 may be determined before an SAP etch is performed. The two dimensional thickness map may provide oxide thickness as a function of position within the substrate plane (X-Y) plane over a targeted region of a substrate, including substantially an entire substrate in some embodiments. The two dimensional thickness map may be generated by any convenient means, such as optical interferometry or other means, and may determine oxide thickness profiles with a resolution on the order of millimeters or centimeters in some embodiments. The two dimensional thickness map may be employed by a processing apparatus, such as processing apparatus 300, to generate a two dimensional SAP etch map or program that provides a targeted etch thickness for an oxide layer as a function of position in the X-Y plane. In particular, the etch program may specify the individual non-uniform etching to be performed by a scanned ion beam in a given exposure cycle over a series of exposure cycles, and the number of rotations, angle of rotations, and so forth. The etch program may accordingly generate a two dimensional non-uniform etching of the oxide layer within a substrate that is specified by the two dimensional SAP etch map.

While the aforementioned embodiments focus on providing oxide isolation structures for fin-type structures, the present embodiments are applicable to providing improved oxide isolation for other type of structures. For example, other embodiments may be employed for any type of patterned structure assembly made of patterned structures coated with an oxide layer, where final oxide isolation structures are achieved by removal of oxide to reveal the patterned structures. Such patterned structures may be semiconductor elements in the shape of pillars, mesas, or other targeted structures. By using a combination of CMP etch and SAP etch as described herein, thickness uniformity of the final oxide at the microscopic level as well as macroscopic level may be improved with respect to known CMP processing techniques that employ just CMP etch operations.

FIG. 4 presents an exemplary process flow 400 according to embodiments of the disclosure. At block 402, chemical mechanical polishing is performed on a fin assembly, wherein the fin assembly includes a plurality of fin structures coated with an oxide layer. The plurality of fin structures may include a nitride layer and a semiconductor layer. In various embodiments, the nitride layer may be an etch stop layer that is disposed on a monocrystalline silicon layer, monocrystalline silicon:germanium alloy layer, or other monocrystalline semiconductor layer. As such, a given fin structure may include a top portion composed of nitride, and a lower portion composed of silicon. In some embodiments, a pad oxide layer may be disposed between the semiconductor layer and the nitride layer. After the chemical mechanical polishing is performed, a first portion, meaning a first thickness, of the oxide layer may be removed.

At block 404 a selective area processing (SAP) etch is performed using ions, wherein a second portion of the oxide layer is removed. The SAP etch may be conducted using an inert gas ion beam shaped as a ribbon ion beam that is scanned across a substrate containing the fin assembly in a series of exposure cycles where the substrate is rotated between exposure cycles. In this manner a non-uniform etching of the oxide layer is generated as a function of position within a plane of the substrate. In this manner, a non-uniformity in oxide layer thickness over macroscopic distances that is present after the chemical mechanical polishing is complete may be reduced or eliminated. At the same time, uniformity of thickness of the oxide layer is also preserved at the micrometer or nanometer level. After the SAP etch the nitride layer may remain covered with the oxide layer.

At block 406 a first oxide etch is performed wherein a third portion of the oxide layer is removed. The first oxide etch may be a liquid etch or a vapor etch, where oxide is selectively etched with respect to other materials. Examples of such etches include dilute HF solutions. As a result, the nitride layer of the fin structures may be exposed.

At block 408, a selective nitride etch is performed wherein the nitride layer of the fin structures is removed. At block 410, a second oxide etch is performed, wherein an upper portion of the semiconductor layer of the fin structures is exposed.

FIG. 5 presents an exemplary process flow 500 according to embodiments of the disclosure. At block 502, a plurality of fin structures is provided on a substrate, wherein the fin structures comprise a plurality of nitride structures. The fin structures may additionally include a plurality of semiconductor fin structures disposed under the plurality of nitride structures. A semiconductor fin structure may include a semiconductor fin and a pad oxide structure disposed on the semiconductor fin, for example.

At block 504, the plurality of nitride structures are removed from the fin structures, exposing the plurality of semiconductor fin structures. At block 506, an oxide layer is deposited on the plurality of semiconductor fin structures. At block 508 a chemical mechanical polishing etch is performed, wherein a first portion of the oxide layer is removed, while the semiconductor fin structures remain covered with oxide.

At block 510, an SAP etch is performed using ions, wherein a second portion of the oxide is layer is removed, while the plurality of semiconductor fin structures remain covered with oxide. At block 512, an oxide etch is performed, wherein a portion of the semiconductor fin structures is exposed. The oxide etch may be a liquid etch or a vapor etch, where oxide is selectively etched with respect to other materials.

The present embodiments provide various advantages over known processes for forming oxide isolation structures using chemical mechanical polishing. For one advantage, the combination of a selective area process etch using a ribbon ion beam in conjunction with CMP etching facilitates the ability to preserve the microscopic smoothness of an oxide layer provided by CMP, while removing macroscopic variation in oxide layer thickness across a substrate. The removal of macroscopic thickness variation in oxide thickness is not generally achievable using CMP, which process also tends to introduce microscopic thickness variation due to patterning effects when polishing an oxide layer down to underlying nitride structures as noted. Moreover, the present embodiments provide the additional advantage of reducing the number of CMP etch operations, which number may be three or more in known CMP etch processing used to achieve isolation structures in finFETs. Additionally, by removing a nitride layer before oxide deposition, some embodiments provide the further advantage of a simplified process flow wherein isolation oxide is deposited on a lower aspect ratio fin structure, facilitating easier coverage between fin structures, and overall thinner oxide deposition.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
    performing a chemical mechanical polishing (CMP) etch of a fin assembly disposed on a substrate, the fin assembly comprising a plurality of fin structures coated with an oxide layer,
    wherein as a result of the CMP etch, a first portion of the oxide layer is removed, and the fin structures remain covered with oxide; and
    performing a selective area processing (SAP) etch using an ion beam during a scan of the substrate, wherein a second portion of the oxide layer is removed in a non-uniform manner by varying a scan speed or by varying an ion current of the ion beam as a function of time during the scan, wherein after the SAP etch, the fin structures remain covered with oxide.

2. The method of claim 1, the plurality of fin structures comprising a nitride layer and a semiconductor layer.

3. The method of claim 2, further comprising:
    performing a first oxide etch, wherein a third portion of the oxide layer is removed, wherein the nitride layer of the plurality of fin structures is exposed;
    performing a selective nitride etch, wherein the nitride layer is removed; and
    performing a second oxide etch, wherein an upper portion of the semiconductor layer of the plurality of fin structures is exposed.

4. The method of claim 1, further comprising forming the fin assembly, wherein the forming the fin assembly comprises:
    providing a semiconductor layer in the substrate;
    forming a nitride layer on the semiconductor layer;
    forming a polysilicon hard mask layer on the nitride layer;
    patterning the polysilicon hard mask layer to form a plurality of polysilicon mandrels;
    etching the nitride layer and semiconductor layer to form the plurality of fin structures; and
    selectively removing the plurality of polysilicon mandrels.

5. The method of claim 1, wherein the performing the SAP etch comprises:
    directing the ion beam as a ribbon ion beam along a first ion trajectory to an upper surface of the oxide layer in a first ion exposure when the substrate is disposed in a first rotational position, the ribbon ion beam comprising a long axis;
    scanning, during the first ion exposure, the substrate in a first scan along a scan direction, the scan direction lying parallel to a plane of the substrate and perpendicular to the long axis;
    performing a first rotation by rotating the substrate with respect to the ribbon ion beam about a perpendicular to the plane from the first rotational position to a second rotational position;
    directing the ribbon ion beam along the first ion trajectory to the upper surface of the oxide layer in a second ion exposure, when the substrate is disposed in the second rotational position; and
    scanning the substrate during the second ion exposure, in a second scan along the scan direction.

6. The method of claim 5, wherein a first thickness of the oxide layer is removed in a first region of the substrate and a second thickness of the oxide layer is removed in a second region of the substrate, where the first thickness and second thickness differ from one another.

7. The method of claim 5, wherein the first ion exposure and the rotation comprise an exposure cycle, wherein the method comprises N exposure cycles, wherein the substrate is rotated between N different rotational positions, wherein N is at least 4.

8. The method of claim 5, wherein at least one of the first scan and the second scan comprises a non-uniform scan, wherein the non-uniform scan comprises varying the scan speed or varying the ion current of the ion beam as a function of time during the first scan or the second scan.

9. The method of claim 8, wherein the scan speed is varied during the non-uniform scan.

10. A method, comprising:
    providing, on a substrate, a plurality of fin structures comprising a plurality of nitride structures disposed over a plurality of semiconductor fin structures;
    removing the plurality of nitride structures, wherein the plurality of semiconductor fin structures are exposed;
    depositing an oxide layer on the plurality of semiconductor fin structures;
    performing a chemical mechanical polishing (CMP) etch, wherein a first portion of the oxide layer is removed; and
    performing a selective area processing (SAP) etch using an ion beam during a scan of the substrate, wherein a second portion of the oxide layer is removed in a non-uniform manner by varying a scan speed or by varying an ion current of the ion beam as a function of time during the scan, wherein after the SAP etch, the plurality of semiconductor fin structures remain covered.

11. The method of claim 10, the plurality of semiconductor fin structures comprising a plurality of pad oxide structures disposed on a respective plurality of semiconductor fins.

12. The method of claim 10, wherein the providing the plurality of fin structures comprising:
providing a semiconductor layer in the substrate;
forming a nitride layer on the semiconductor layer;
forming a polysilicon hard mask layer on the nitride layer;
patterning the polysilicon hard mask layer to form a plurality of polysilicon mandrels;
etching the nitride layer and semiconductor layer while the polysilicon mandrels are present; and
selectively removing the plurality of polysilicon mandrels.

13. The method of claim 11, further comprising: performing an oxide etch, wherein an upper portion of the semiconductor fins is exposed.

14. The method of claim 10, wherein the performing the SAP etch comprises:
directing the ion beam as a ribbon ion beam along a first ion trajectory to an upper surface of the oxide layer in a first ion exposure when the substrate is disposed in a first rotational position, the ribbon ion beam comprising a long axis;
scanning, during the first ion exposure, the substrate in a first scan along a scan direction, the scan direction lying parallel to a plane of the substrate and perpendicular to the long axis;
performing a first rotation by rotating the substrate with respect to the ribbon ion beam about a perpendicular to the plane from the first rotational position to a second rotational position;
directing the ribbon ion beam along the first ion trajectory to the upper surface of the oxide layer in a second ion exposure, when the substrate is disposed in the second rotational position; and
scanning, during the second ion exposure, the substrate in a second scan along the scan direction.

15. The method of claim 14, wherein at least one of the first scan and the second scan comprises a non-uniform scan, wherein the non-uniform scan comprises varying the scan speed or varying the ion current of the ion beam as a function of time during the first scan or the second scan.

16. The method of claim 15, wherein the scan speed is varied during the non-uniform scan.

17. A method, comprising:
performing a chemical mechanical polishing (CMP) etch of a patterned structure assembly disposed on a substrate, the patterned structure assembly comprising a plurality of patterned structures coated with an oxide layer,
wherein as a result of the CMP etch, a first portion of the oxide layer is removed, and the patterned structures remain covered with oxide; and
after the CMP etch, performing a selective area processing (SAP) etch using a ribbon ion beam during a scan of the substrate, the SAP etch comprising a non-uniform etch process tailored according to a thickness non-uniformity of the oxide layer across the substrate, the thickness non-uniformity determined after the CMP etch, the non-uniform etch process comprising varying a can speed or varying an ion current of the ribbon ion beam as a function of time during the scan.

18. The method of claim 17, wherein the plurality of patterned structures comprises a plurality of fin structures, the plurality of fin structures comprising at least a semiconductor layer.

* * * * *